US007928875B2

(12) United States Patent
Kirichenko

(10) Patent No.: US 7,928,875 B2
(45) Date of Patent: Apr. 19, 2011

(54) SUPERCONDUCTOR ANALOG-TO-DIGITAL CONVERTER

(75) Inventor: Dmitri Kirichenko, Pleasantville, NY (US)

(73) Assignee: Hypres, Inc., Elmsford, NY (US)

( * ) Notice: Subject to any disclaimer, the term of this patent is extended or adjusted under 35 U.S.C. 154(b) by 38 days.

(21) Appl. No.: 12/548,396

(22) Filed: Aug. 26, 2009

(65) Prior Publication Data
US 2010/0026537 A1 Feb. 4, 2010

Related U.S. Application Data

(63) Continuation of application No. 11/955,666, filed on Dec. 13, 2007, now Pat. No. 7,598,897.

(51) Int. Cl.
H03M 1/00 (2006.01)
(52) U.S. Cl. ......................................... 341/133; 341/155
(58) Field of Classification Search .................. 341/133, 341/172, 143, 120, 155, 118, 161, 144
See application file for complete search history.

(56) References Cited

U.S. PATENT DOCUMENTS

| 5,140,324 | A | 8/1992 | Przybysz | 341/133 |
| 5,341,136 | A * | 8/1994 | Przybysz et al. | 341/133 |
| 6,157,329 | A | 12/2000 | Lee | 341/133 |
| 7,038,604 | B2 | 5/2006 | Hirano | 341/133 |
| 7,057,541 | B1 | 6/2006 | Kaplan | 341/143 |

OTHER PUBLICATIONS

Q. P. Herr "Inductive Isolation in Stacked SQUID Amplifiers" IEEE Transactions on Applied Superconductivity, vol. 17, pp. 565-568, (2007).
"High Performance, All Digital RF Receiver Tested at 7.5 GigaHertz" Wong, Jack;Kirichenko, Dmitri; et al. Military Communications Conference, 2007. MILCOM 2007. IEEE, Oct. 29-31, 2007 pp. 1-5, Digital Object Identifier 10.1109/MILCOM.2007.4455052.

* cited by examiner

Primary Examiner — Joseph Lauture
(74) Attorney, Agent, or Firm — George Sai-Halasz

(57) ABSTRACT

A superconducting Analog-to-Digital Converter (ADC) employing rapid-single-flux-quantum (RSFQ) logic is disclosed. The ADC has only superconductor active components, and is characterized as being an $N^{th}$-order bandpass sigma-delta ADC, with the order "N" being at least 2. The ADC includes a sequence of stages, which stages include feedback loops and resonators. The ADC further includes active superconducting components which directionally couple resonator pairs of adjacent stages. The active superconducting components electrically shield the higher order resonator from the lower order resonator. These active superconductor components include a superconducting quantum interference device (SQUID) amplifier, which is inductively coupled to the higher order resonator, and may include a Josephson transmission line (JTL), which is configured to electrically connect the SQUID amplifier to the lower order resonator. The first stage of ADC may employ an implicit feedback loop.

20 Claims, 4 Drawing Sheets

US 7,928,875 B2

SUPERCONDUCTOR ANALOG-TO-DIGITAL CONVERTER

CROSS REFERENCE TO A RELATED APPLICATION

This application is a Continuation of application Ser. No. 11/955,666, filed Dec. 13, 2007, now U.S. Pat. No. 7,598,897 issued Oct. 6, 2009, which is incorporated herein by reference in its entirety.

GOVERNMENT INTERESTS

The invention was produced under U.S. Army CERDEC SBIR Contracts W15P7T-04-C-K605 and DAAB07-03-C-D202, and U.S. Navy ONR Contract N0014-02-C-0171. The United States Government has certain rights in this invention.

FIELD OF THE INVENTION

The present invention relates to superconducting electronics. In particular, it relates to oversampled Analog-to-Digital Converters.

BACKGROUND OF THE INVENTION

One well-known class of analog-to-digital converters (ADCs) is based on oversampling, in which a single-bit quantizer with feedback is used to generate a fast bit sequence that can accurately represent an analog input signal in the band of interest. This requires high sampling rates, for which superconducting electronics is particularly well suited.

The established $\Sigma\Delta$ approach to an oversampling low-pass ADC is based on sigma-delta ($\Sigma\Delta$) modulation (also called delta-sigma [$\Delta\Sigma$] modulation), in which the input signal minus a feedback signal is integrated before quantization. This is well known to result in "noise shaping", where the quantization noise associated with the data conversion is shifted outside the frequency band of interest. The shifted noise may then be eliminated by a subsequent digital filter. This approach has been generalized to higher order, with multiple integrators and multiple feedback loops, by which the noise-shifting is further enhanced. For the higher order approach to work properly, each integrator must be well isolated from its neighbor. In conventional semiconductor technology, this isolation is achieved with transistor amplifiers.

A further known generalization of $\Sigma\Delta$ modulators is achieved by replacing the integrators by high-Q resonators. This suppresses the quantization noise at a resonant frequency rather than at low-frequencies, and forms the basis for a bandpass ADC. Again, improved higher-order performance requires good isolation between the resonators.

Superconducting circuits based on Josephson junctions, in configurations known as rapid single-flux-quantum (RSFQ) logic, can switch on the picosecond timescale, leading to high sampling rates. Przybysz et al. in U.S. Pat. No. 5,140,324 described a first order, single stage, low-pass sigma-delta ADC based on Josephson junctions. Later this was extended to a first order, single stage, bandpass sigma-delta ADC in U.S. Pat. No. 5,341,136. Both of these patents are incorporated herein by reference.

Lee et al. in U.S. Pat. No. 6,157,329, incorporated herein by reference, demonstrated that one can avoid a feedback loop in a superconducting bandpass $\Sigma\Delta$ modulator by making use of a special feature of Josephson circuits, known as implicit feedback. This technique provides electrical feedback without an explicit loop. However, this approach is applicable only to first-order, one stage, feedback. So far a higher order bandpass ADC in fully superconducting technology has not been achieved.

SUMMARY OF THE INVENTION

In view of the discussed difficulties, embodiments of the present invention disclose a superconducting Analog-to-Digital Converter (ADC) without active semiconductor components, which is characterized as being an $N^{th}$-order bandpass sigma-delta ADC. The ADC includes a sequence of stages, which stages include resonators. Each one of these resonators uniquely pertains to one of the stages. The stages number N, with N being at least 2. The stages and the resonators are being characterized by their order in the sequence, with the order having values from 1 through N. The analog signal to be digitized is received by the N-th order stage. The ADC further includes active superconducting components that directionally couple resonator pairs having adjacent orders. The active superconducting components electrically shield the higher order resonator from the lower order resonator. These active superconducting components include a superconducting quantum interference device (SQUID) amplifier, which is inductively coupled to the higher order resonator, and may include a Josephson transmission line (JTL), which is configured to electrically connect the SQUID amplifier to the lower order resonator.

BRIEF DESCRIPTION OF THE DRAWINGS

These and other features of the present invention will become apparent from the accompanying detailed description and drawings, wherein.

DETAILED DESCRIPTION OF THE INVENTION

Figure 1A:
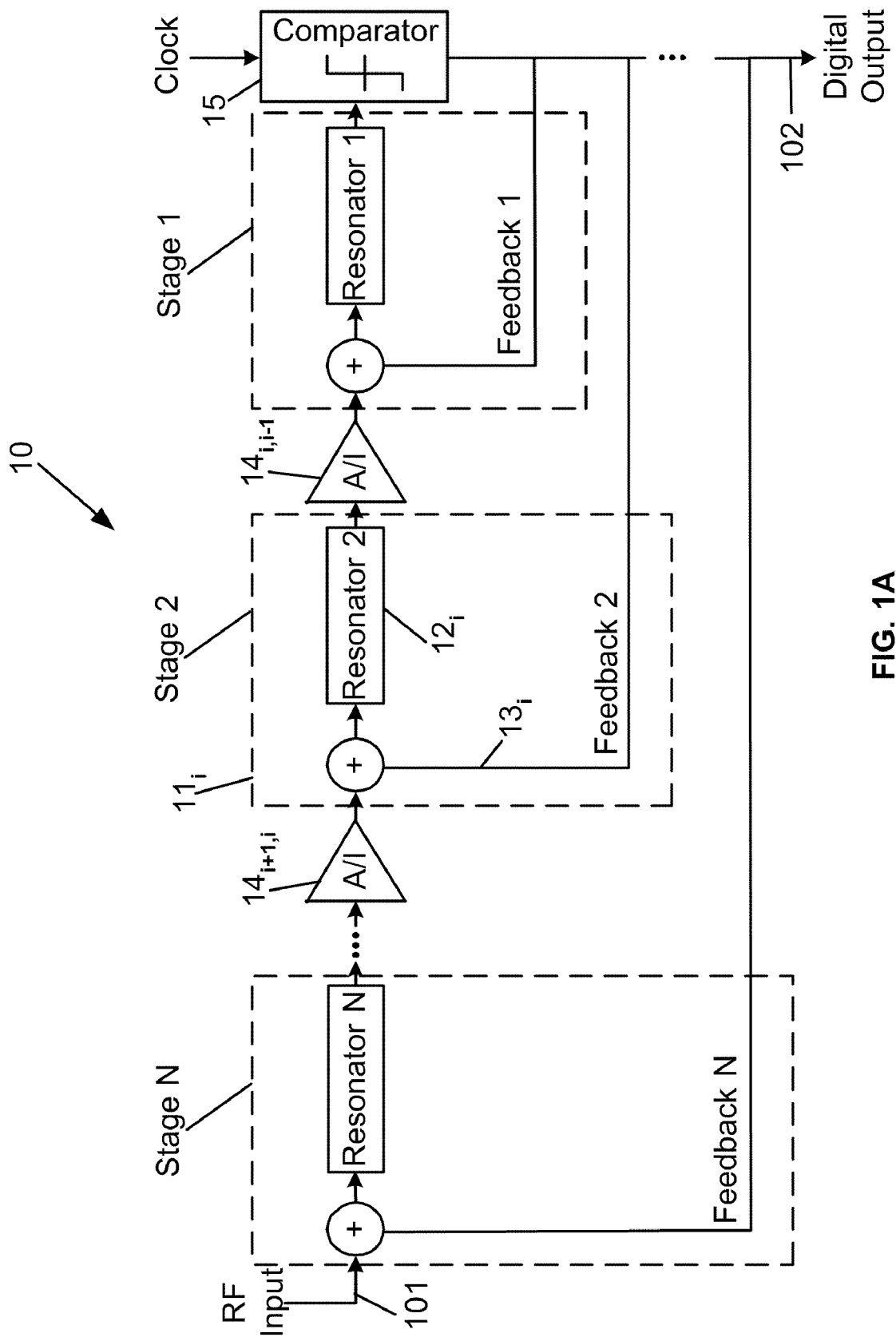
FIG. 1A shows a schematic diagram of a superconductor $N^{th}$-order bandpass Sigma—delta ADC according to an embodiment of the present invention.

It is understood that sigma-delta ($\Sigma\Delta$) analog-to-digital converters (ADC), also known as $\Sigma\Delta$ modulators, or delta-sigma ($\Delta\Sigma$) modulators/ADC-s, are well known in the electronic arts. Basic concepts of superconductor ADC-s, meaning ADC-s composed of superconducting components, which components may include both active and passive components, have been discussed already, for instance by O. A. Mukhanov et al. in "Superconductor Analog-to-Digital Converters", Proc. IEEE, Vol. 92, pp. 1564-1584 (2004).

Briefly, in a low-pass ADC based on sigma-delta ($\Sigma\Delta$) modulation the input signal (minus an error feedback signal) is integrated before quantization. A variation of $\Sigma\Delta$ ADC-s is achieved by replacing the integrators by resonators. Using a resonator suppresses the quantization noise at a resonant frequency rather than at low-frequencies. Such an ADC is called in the art a bandpass ADC. For both the low pass, integrator type, and the bandpass, resonator type, ΣΔ ADC-s one can extend the ADC operation to higher order, with multiple stages of integrators, or resonators, and with corresponding multiple feedback loops. Higher order ΣΔ ADC-s enhance performance by shifting noise further away from the frequency band of interest. For the proper operation of higher order ADC-s it is desirable that each integrator, or resonator, be well isolated from its lower order neighbor.

With semiconductor technology isolation of successive feedback stages, involving either integrators, or resonators, is quite straightforward due to the amplification capabilities of transistors, and both multistage low pass and bandpass ΣΔ ADC have been already been introduced. However, since superconducting technology lacks a component such as a transistor, in the art it was generally assumed that higher order ΣΔ ADC are not possible to achieve with superconductive technology. See, for instance, discussion in Q. P. Herr, et al., in "Inductive Isolation in Stacked SQUID Amplifiers" IEEE Transactions on Applied Superconductivity, Vol. 17, pp. 565-568, (2007), where semiconductor transistors are being applied in a hybrid semiconductor/superconductor technology to realize a low pass, two stage ΣΔ ADC.

Embodiments of the present disclosure are characterized as being higher-order bandpass sigma-delta ADC-s, employing superconductive technology, having only superconductor active components. The use of superconductive technology allows for hitherto unattainable sampling performance, as characterized by both frequency and accuracy.

The term active superconductor component in this disclosure carries the general accepted meaning used in the art. Active superconductive components generally involve tunnel junctions, most commonly Josephson junctions (JJ). Typical active superconductor components include single JJ-s, Josephson transmission lines (JTL), superconducting quantum interference devices (SQUID), and various combinations of these. Generally, but not exclusively, active superconducting components have some kind of bias condition, for instance, and without limitation, a current bias. Active semiconductor components, which are absent in embodiments of the present disclosure, have their meaning in the art typically as transistors and diodes. Active semiconductor components usually, but not exclusively, operate under some kind of bias conditions, as well.

FIG. 1A shows a schematic diagram of a superconductor $N^{th}$-order bandpass Sigma—delta ADC 10 according to a representative embodiment of the present invention. The ADC of FIG. 1A receives an RF analog input signal 101 and outputs 102 digital pulses, consequently, in this disclosure it is usually referred to as a ΣΔ ADC. Such a nomenclature is not meant to imply limitations. Often, in the art such a structure 10 is named ΣΔ modulator, since its digital output 102 is usually further processed, for instance, deserialized, filtered, etc, before a final multibit output is presented as the output of the ADC. For embodiments of the present invention any and all signal processing, past the digital output 102, are not of major importance, and are not limiting the scope of the invention.

The schematic of the superconducting bandpass ΣΔ ADC 10 is not unlike the ones already known in the art. An $N^{th}$ order ADC has N stages. In embodiments of the present invention, the "N" order of the ADC is at least 2. The stages are arranged in a sequence, with the stages being characterized by their order in the sequence, from 1 through N. In FIG. 1A all repeated components, such as stages, resonators, feedback loops, are indicated with an "i" subscript, with "i" taking on the value of the particular order. Thus, for instance, resonator 2 being of order of "2" would have the indicator number $12_2$.

The stages $11_i$ each have a resonator $12_i$, with each one of the resonators $12_i$ uniquely pertaining to one of the stages $11_i$. The analog RF signal to be digitized is being received 101 by the highest order stage, the one having order N. All other stages receive their inputs by combining two signals. One of these two signals is coming from a feedback loop $13_i$. The other signal of the combination comes from the immediate higher order stage, through amplification/isolation (A/I) components $14_{i+1,i}$. Since these A/I components are coupling adjacent order stage pairs, their indicator numbers carry two subscripts, namely the order of the coupled stages. Thus, for instance, the A/I coupling stage 3, $11_3$, to stage 2, $11_2$, would be indicated as $14_{3,2}$.

The output of the first order stage $11_1$ feeds into a clocked comparator 15. The comparator 15 outputs pulses, which pulses then proceed back into the feedback loops $13_i$, and to the output 102 of the ADC. The resonators of the feedback loops $13_i$ convert the pulses back to analog signals.

FIG. 1A is only a schematic representation of an $N^{th}$ order ΣΔ ADC 10. Embodiments of the invention may contain additional components, or fewer components, as such may be known in the art. Additional components may be, without limitation, latches, clocks, delay elements in the feedbacks, and others.

The inductors of the resonators of the ΣΔ modulator/ADC of FIG. 1A, may contain a string of Josephson junctions. Such a string of Josephson junctions due to the nature of superconductivity can be configured to act as a tunable inductor.

In embodiments of the present disclosure all components of the ΣΔ ADC 10 are superconductors, used in the general framework of rapid single-flux-quantum (RSFQ) technology. The comparator 15 generates single-flux-quantum (SFQ) pulses. Using only superconductor active components holds for the A/I $14_{i+1,i}$ units. As discussed earlier, the prevailing assumption in the art was that superconducting components are not suitable for such a role, primarily because they are not capable for directional coupling. Without directional coupling, the lower stage $11_i$ may electrically backward disturb the preceding, higher order stage $11_{i+1}$, which may lead to instability in the whole of the ΣΔ ADC 10.

Embodiments of the present disclosure manifest that a high performance bandpass ΣΔ ADC 10 is achievable with active superconductive components in the A/I $14_{i+1,i}$ units between successive pairs of stages.

Figure 1B:
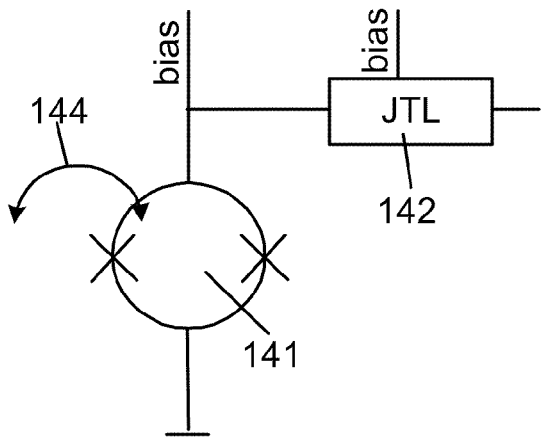
FIG. 1B shows a schematic diagram of an amplification/isolation unit of the ADC according to an embodiment of the present invention.

FIG. 1B shows a schematic diagram of an amplification/isolation (A/I) unit of the ADC according to an embodiment of the present invention. Active superconducting components non-reciprocally, directionally, couple pairs of adjacent order resonators $12_i$, namely, a higher order resonator and a lower order resonator. The active superconducting components of the A/I $14_{i+1,i}$ electrically shield the higher order resonator $12_{i+1}$ from the lower order resonator $12_i$. The A/I $14_{i+1,i}$ contains a SQUID amplifier 141. The SQUID amplifier 141 is inductively coupled 144 to the higher order resonator $12_{i+1}$. The inductive coupling 144 is instrumental in the non-reciprocity of the couplings between successive stages of the ADC. To further enhance directionality and the isolation of the higher order stage, a Josephson transmission line (JTL) 142 may follow the SQUID amplifier 141. The JTL 142 may also regenerate and amplify SFQ pulses.

Both the SQUID amplifier 141 and the JTL 142 are well known active superconducting components, see, e.g., U.S. Pat. Nos. 4,585,999 and 5,936,458, but have not been used in the role as disclosed in representative embodiments of the present invention. The SQUID amplifier 141 requires a DC bias to operate, so that it would not function properly with a low-pass ADC. This DC bias is not a problem for a bandpass ADC, where only alternating currents have to pass along the ADC. Also, the SQUID amplifier 141 may have some nonlinearity, a disadvantage for optimum noise suppression. However, in spite of such potential difficulties, embodiments of the present disclosure show functioning of the bandpass ΣΔ ADC 10 with unprecedented performance.

A superconducting ΣΔ ADC in one respect has a unique advantage compared to a semiconductor ΣΔ ADC. This advantage is a direct result of the quantum nature of Josephson junctions (JJ). When a JJ clocked through a second JJ switches, it subtracts a single flux quantum (SFQ=2.07 fWb) from the input while producing a digital output SFQ pulse. The comparator 15 of the ΣΔ ADC may use such a two JJ scheme. The subtraction of the pulse from the input is precisely what a feedback loop would be doing in a ΣΔ ADC. Consequently, there may not be a need for an explicit feedback loop $13_1$, for the first stage $11_1$. The feedback can be implicit for the first stage $11_1$. The possibility for such an implicit feedback for the first stage in a superconductor ADC using SFQ technology has already been demonstrated in the art, see for instance, Lee et al. U.S. Pat. No. 6,157,329. However, the implicit feedback is useable only for the first stage of a ΣΔ ADC, for higher order structures, with N being at least 2, one is forced to use explicit feedback, and the A/I units are unavoidable. Hence, the SFQ pulses produced by the comparator 15 have to be propagated back into at least 1 of the feedback loops $13_i$.

Figure 2:
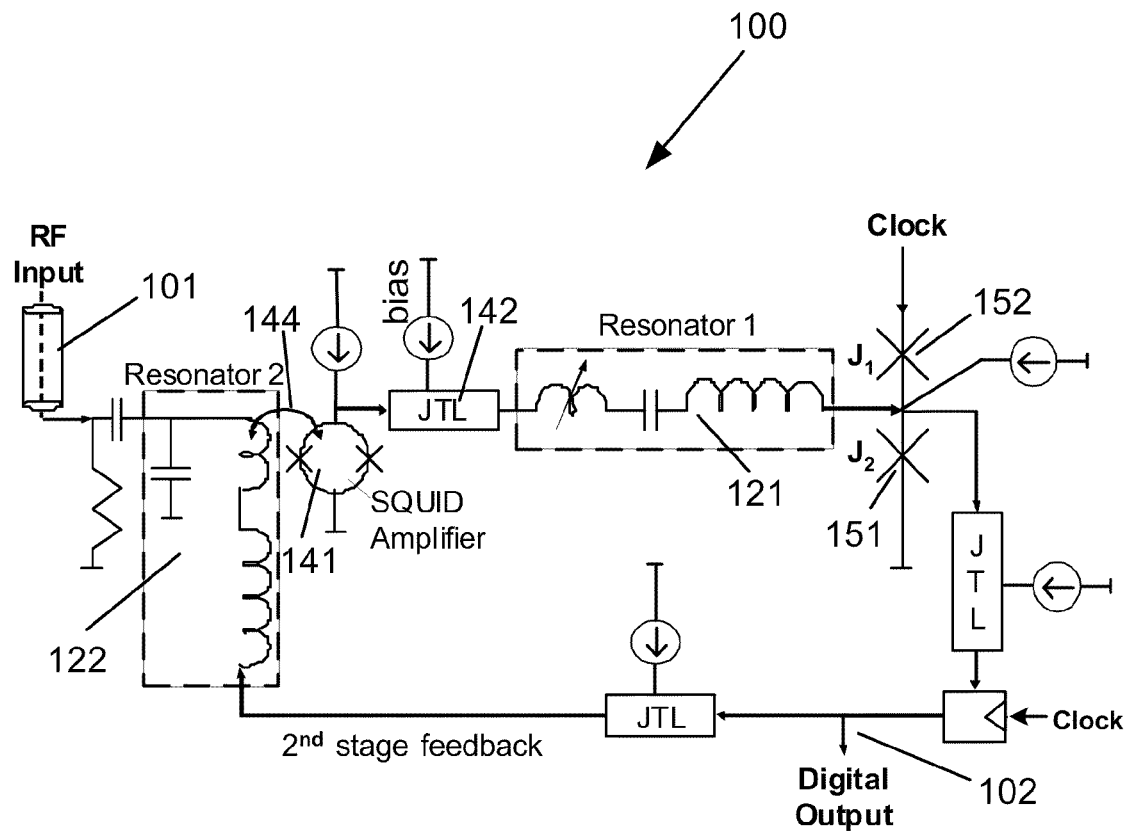
FIG. 2 shows a schematic diagram of a superconductor 2d-order bandpass Sigma—delta ADC according to an embodiment of the present invention.

FIG. 2 shows a schematic diagram of a superconductor 2d-order bandpass sigma-delta ADC according to an embodiment of the present invention. This 2d-order ΣΔ ADC 100 employs only superconductive technology, having exclusively superconductive active components. The ADC has two resonators 121, 122, but only the second stage has an explicit feedback loop. The feedback of the first stage is implicit. The comparator is a JJ 151, which is clocked through second JJ 152. Such an arrangement has been known in the art. In a niobium (Nb), nominally 1 μm, technology such a comparator is capable of a pulse rate close to 50 GHz. With a technology of submicron groundrules a pulse rate exceeding 100 GHz is achievable. The comparator JJ 151 subtracts a single flux quantum from the input while producing a digital output SFQ pulse, and thus, provides for the implicit feedback.

The signal to be digitized is being received 101 by the second resonator 122, while the first resonator 121 feeds into the comparator JJ junction 151. The JJ junction comparator 151 is generating SFQ pulses, which are directed to the second stage feedback loop and to the ADC output 102.

The coupling between the two resonators is accomplished with components as discussed in connection with FIG. 1B. A superconducting quantum interference device (SQUID) 141 amplifier and a Josephson transmission line (JTL) 142 provide non-reciprocal, directional, coupling between the second resonator 122 and the first resonator 121. The SQUID amplifier 141 is inductively coupled 144 to the second resonator 122. The JTL 142 electrically connects the SQUID amplifier 141 to the first resonator 121.

FIG. 2 also shows elements that may typically be present in a second order bandpass ΣΔ ADC. Such elements are JTL-s with the purpose of pulse shaping and controlling delay, as total loop delay may need to be adjusted for optimum performance, additional clocks, to adjust phases, and several biasing sources for proper device operation. All of these are shown for illustrative purposes and without intent of limitation.

As discussed previously, the ΣΔ ADC shown in FIG. 1A and FIG. 2 are often referred to in the art as ΣΔ modulators because they may be embedded into, and are forming the core of, a larger system. Such a system may be a digital radio frequency (RF) receiver. For converting an electromagnetic analog signal into a digital signal, such a RF receiver may use a method involving a representative embodiment of the $N^{th}$-order bandpass ΣΔ modulator.

Embodiments of the present invention are representative of RSFQ logic, and are not tied to any given superconducting material, or technology. Embodiments practiced with any superconductive material, or materials, including so called high-$T_c$ superconductors, are within the scope of the present disclosure.

Figure 3:
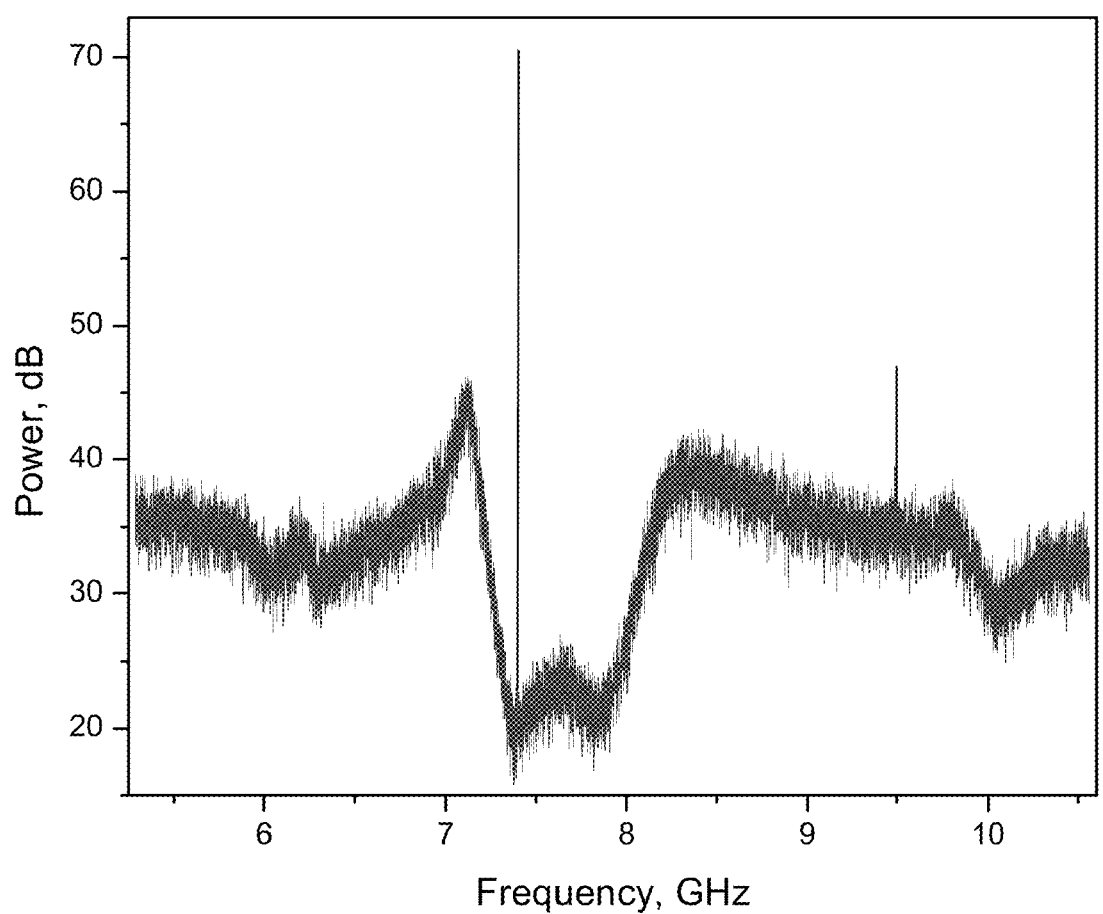
FIG. 3 shows a measured output spectrum for a 7.6 GHz input signal and 10.5 GHz sampling rate, showing second-order noise shaping.

FIG. 3 shows a measured output spectrum of the 2d-order ΣΔ ADC 100 for a 7.4 GHz input signal and 10.5 GHz sampling rate, showing second-order noise shaping. Given the very high sampling rate, the output of the ADC 100 is difficult to measure directly. To demonstrate the performance, a special test chip was fabricated that incorporates a deserializer that reduces the output data rate by a factor of 16. All 16 lines are fed out in parallel to a field-programmable gate array (FPGA) which can reconstruct the data for computation of the power spectrum as shown in FIG. 3. For test purposes a sinusoidal signal at 7.4 GHz was used, together with a clock, or sampling, frequency of $f_{clk}$=10.5 GHz. The first 121 and the second 122 resonators were set at $f_1$=7.4 GHz and $f_2$=7.8 GHz. The correct operation of the ΣΔ ADC 100 is visible by noise shaped with two dips, near each of the resonant frequencies. This demonstrated the second-order response. Also the input signal shows up as the sharp peak at 7.4 GHz.

Some applications may involve live satellite signals received by an antenna. The output signal of the antenna may be the analog input signal for the superconducting ΣΔ modulator. The demonstrated sensitivity of the ΣΔ modulator/ADC is sufficient for one to feed the analog output signal of the antenna directly into the superconducting circuit as an analog input signal, eliminating the need for inbetween amplification.

Figure 4:
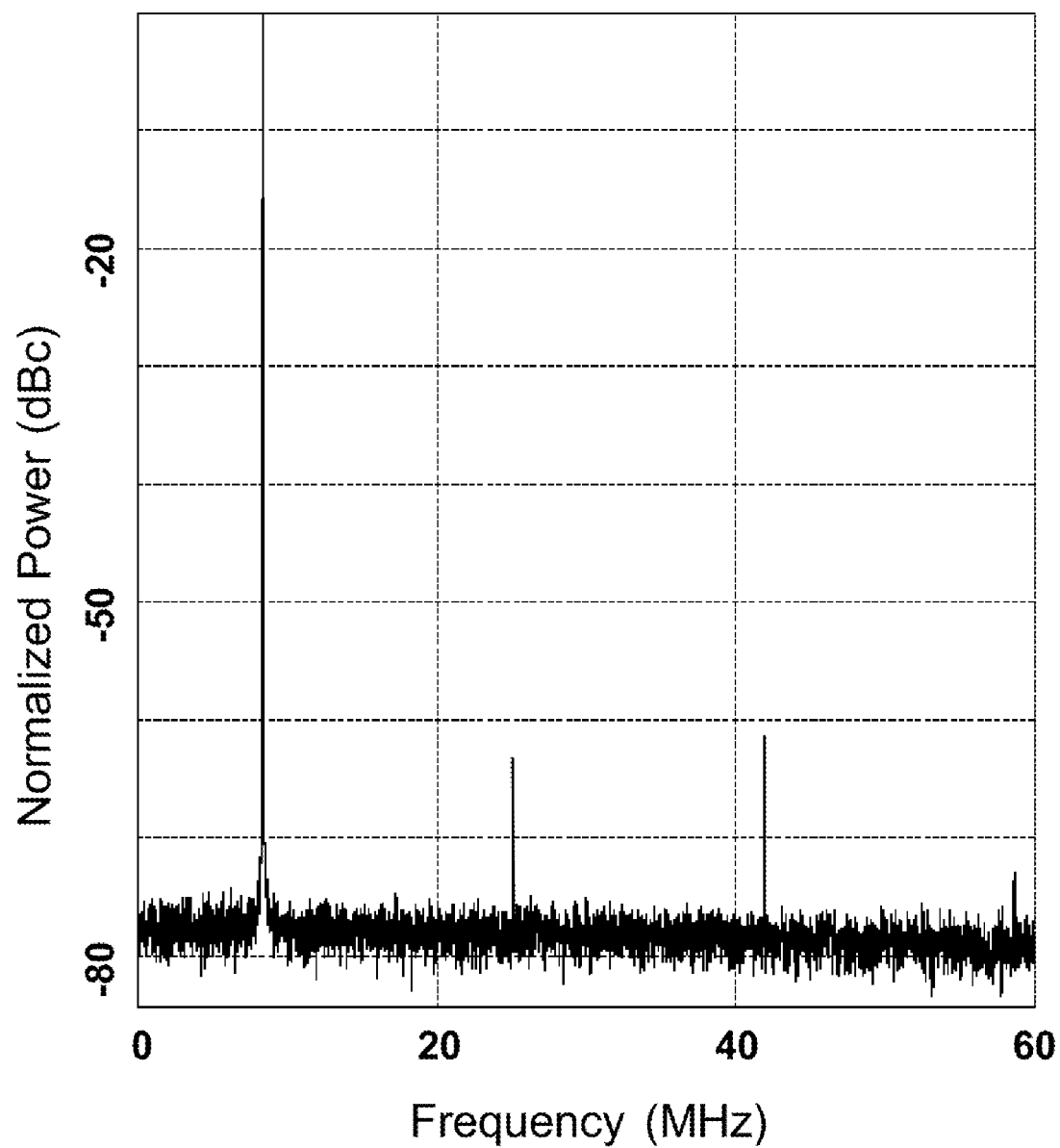
FIG. 4 shows a measured power spectrum in a 60 MHz output band after digital downconversion and decimation for a 7.6 GHz test signal and 30 GHz sampling rate.

FIG. 4 shows a measured power spectrum in a 60 MHz output band after digital downconversion and decimation for 7.6 GHz test signal and 30 GHz sampling rate. The power spectrum comes from an X-band all-digital receiver implemented as an integrated circuit on a single chip in all superconductor Nb technology with 1.5 μm groundrules. At such dimensions the JJ critical current, Jc, is 4.5 kA/cm$^2$. A sinusoidal test signal enters a 2d-order bandpass ΣΔ ADC 100 such as that of FIG. 2, which ΣΔ ADC is embedded in the X-band all-digital receiver. The first 121 and the second 122 resonators were set at $f_1$=7.4 GHz and $f_2$=7.6 GHz. The signal to noise ratio for a 120 MHz output band is 41 dB, corresponding to 6.5 effective bits, and the spur-free dynamic range (SFDR), a measure of merit known in the art, is 60 dB, corresponding to approximately 10 bits.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:
1. A superconducting circuit, comprising:
  a sequence of stages, wherein said stages comprise resonators, wherein each one of said resonators uniquely pertains to one of said stages, wherein said stages number N, with N being at least 2, wherein said stages and said resonators are being characterized by an order in said sequence, said order having values from 1 through N, and wherein a stage having N as said order is configured to receive an analog input signal; and
  active superconducting components directionally coupling pairs of said resonators, wherein said orders of said resonators in said pairs are adjacent to one another, wherein each of said pairs is having a higher order resonator and a lower order resonator, wherein said active superconducting components electrically shield said higher order resonator from said lower order resonator.

2. The superconducting circuit of claim 1, wherein said active superconducting components comprise a superconducting quantum interference device (SQUID) amplifier, wherein said SQUID amplifier is inductively coupled to said higher order resonator.

3. The superconducting circuit of claim 2, wherein said active superconducting components further comprise a Josephson transmission line (JTL), wherein said JTL is configured to electrically connect said SQUID amplifier to said lower order resonator.

4. The superconducting circuit of claim 3, wherein said resonators comprise inductors, and at least one of said inductors comprise a string of Josephson junctions.

5. The superconducting circuit of claim 1, further comprising:
  feedback loops associated with said stages; and
  a comparator receiving an input from a stage having 1 as said order, wherein said comparator is generating single flux quantum (SFQ) pulses, and wherein said SFQ pulses are directed to at least 1 of said feedback loops and to an output for said superconducting circuit.

6. The superconducting circuit of claim 5, wherein said stage having 1 as said order is associated with an implicit feedback loop.

7. The superconducting circuit of claim 1, wherein said superconducting circuit is characterized as being an $N^{th}$-order bandpass sigma-delta modulator.

8. A system for digitally receiving radio frequencies, comprising:
  a superconducting circuit characterized as being an $N^{th}$-order bandpass sigma-delta modulator, wherein said superconducting circuit further comprises:
  a sequence of stages, wherein said stages comprise resonators, wherein each one of said resonators uniquely pertains to one of said stages, wherein said stages number N, with N being at least 2, wherein said stages and said resonators are being characterized by an order in said sequence, said order having values from 1 through N, and wherein a stage having N as said order is configured to receive an analog input signal; and
  active superconducting components directionally coupling pairs of said resonators, wherein said orders of said resonators in said pairs are adjacent to one another, wherein each of said pairs is having a higher order resonator and a lower order resonator, wherein said active superconducting components electrically shield said higher order resonator from said lower order resonator.

9. The system of claim 8, wherein said active superconducting components comprise a superconducting quantum interference device (SQUID) amplifier, wherein said SQUID amplifier is inductively coupled to said higher order resonator.

10. The system of claim 9, wherein said active superconducting components further comprise a Josephson transmission line (JTL), wherein said JTL is configured to electrically connect said SQUID amplifier to said lower order resonator.

11. The system of claim 8, wherein said superconducting circuit further comprises a comparator receiving an input from a stage having 1 as said order, wherein said comparator is generating single flux quantum (SFQ) pulses, wherein said SFQ pulses are directed to at least 1 of said feedback loops and to an output for said superconducting circuit.

12. The system of claim 8, wherein said system further comprises an antenna configured to receive said radio frequencies and to yield an analog output signal.

13. The system of claim 12, wherein said analog output signal is entered directly into said superconducting circuit as said analog input signal.

14. A 2-d order superconducting bandpass sigma-delta modulator, comprising:
  a first resonator and a second resonator, wherein an analog signal to be digitized is being received by said second resonator;
  a superconducting quantum interference device (SQUID) amplifier and a Josephson transmission line (JTL), wherein said SQUID amplifier is inductively coupled to said second resonator, and wherein said JTL electrically connects said SQUID amplifier to said first resonator;
  a first feedback loop associated with said first resonator and a second feedback loop associated with said second resonator, wherein said first feedback loop is an implicit feedback loop; and
  a comparator receiving an input from said first resonator, wherein said comparator is generating single flux quantum (SFQ) pulses, wherein said SFQ pulses are directed to said second feedback loop and to an output for said modulator.

15. A method for converting an electromagnetic analog signal into a digital signal, said method comprising:
  implementing a superconducting circuit characterized as being an $N^{th}$-order bandpass sigma-delta modulator, and in said superconducting circuit:
  applying a sequence of resonators, wherein said resonators number N, characterizing said resonators by an order in said sequence, said order having values from 1 through N, with N being at least 2, receiving said analog signal in a resonator having N as said order;
  providing directional coupling with active superconducting components between pairs of said resonators, selecting said orders of said resonators in said pairs to be adjacent to one another, wherein each of said pairs is having a higher order resonator and a lower order resonator, choosing said directional coupling in a manner to shield said higher order resonator from said lower order resonator.

16. The method of claim 15, wherein said providing of said directional coupling comprises inductively coupling a superconducting quantum interference device (SQUID) amplifier to said higher order resonator.

17. The method of claim 16, wherein said providing of said directional coupling further comprises connecting said SQUID amplifier to said lower order resonator through a Josephson transmission line (JTL).

18. The method of claim 15, wherein said method further comprises associating said resonators with feedback loops, and having a comparator generating single flux quantum (SFQ) pulses for at least 1 of said feedback loops and for an output of said superconducting circuit, while a resonator having 1 as said order is supplying signals for said comparator.

19. The method of claim 18, wherein said method further comprises associating an implicit feedback loop with said resonator having 1 as said order.

20. The method of claim 15, wherein said method further comprises providing inductors for said resonators and to include a string of Josephson junctions in at least one of said inductors.

* * * * *